United States Patent [19]

Zehl et al.

[11] Patent Number: 4,503,388
[45] Date of Patent: Mar. 5, 1985

[54] ACOUSTO-OPTIC SIGNAL DETECTION SYSTEM

[75] Inventors: Otis G. Zehl, College Park; Michael G. Price, Seabrook; Edward H. David, Jr., College Park; Jerome C. Kremen, Takoma Park, all of Md.

[73] Assignee: Litton Systems, Inc., College Park, Md.

[21] Appl. No.: 435,098

[22] Filed: Oct. 18, 1982

[51] Int. Cl.³ .............................................. G01R 27/02
[52] U.S. Cl. .................................... 324/77 K; 455/619
[58] Field of Search ............ 324/77 K; 365/123, 124, 365/125; 455/611, 619; 350/358

[56] References Cited

U.S. PATENT DOCUMENTS

| | | | |
|---|---|---|---|
| 3,742,224 | 6/1973 | Einstein | 250/213 VT |
| 4,097,898 | 6/1978 | Geluk | 324/77 K |
| 4,206,347 | 6/1980 | Avicola et al. | 350/358 |
| 4,328,576 | 5/1982 | Oakley | 324/77 K |

OTHER PUBLICATIONS

"Dielectric Materials for Electrooptic, Elastooptic, & Ultrasonic Device Applications", Spencer et al., Proceedings of the IEEE, vol. 55, No. 12, Dec. 1967, pp. 2074–2108.

Litton Industries, Inc., "Annual Report for the Fiscal Year 1981," p. 19.

Isomet Corp., Application Notes all About Bragg Angle Errors in Acousto-Optic Modulators & Deflectors," Sep. 1977, pp. 1 to 23.

Probe Systems, Inc., "Optical Excision Program Electronic Clipper," Reporting Period: Apr. 1, 1979 through Jan 31, 1980, pp. 2-1 to 2-7.

Litton Industries, Inc., "Look to Litton to Enhance Your Image," Dec. 1981, all pages.

Primary Examiner—Stewart J. Levy
Attorney, Agent, or Firm—Robert F. Rotella; Michael H. Wallach

[57] ABSTRACT

A system is shown which receives several radio frequency (RF) signals and applies these signals to a Bragg cell through which a beam of coherent light is passed and diffracted into several first order beamlets. The diffraction angle of the beamlets is a function of the frequency of the RF signals. The beamlets are amplified in an amplifier having a fast response time to match the response time of the system. Fiber optic bundles are provided at the input and output of the amplifier to guide the beamlets from a linear pattern into an areal pattern and to spread the beamlets for a more efficient use of the amplifier. The amplified beamlets are then formed into a linear pattern and applied to a photodetector to determine the frequency of the RF signals.

10 Claims, 8 Drawing Figures

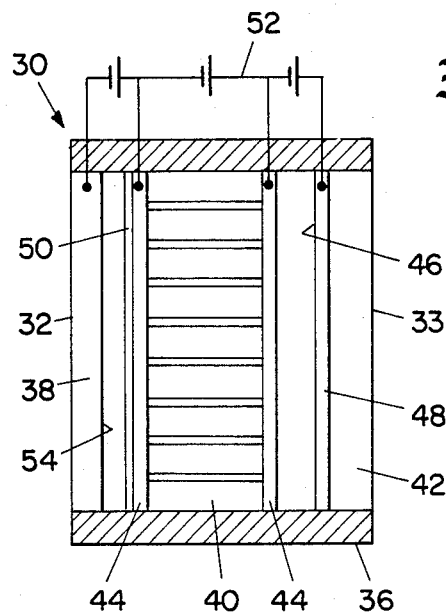
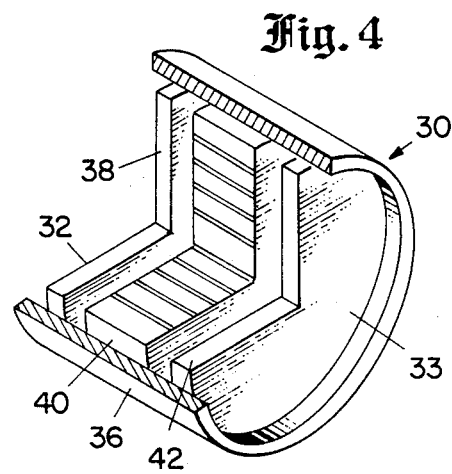
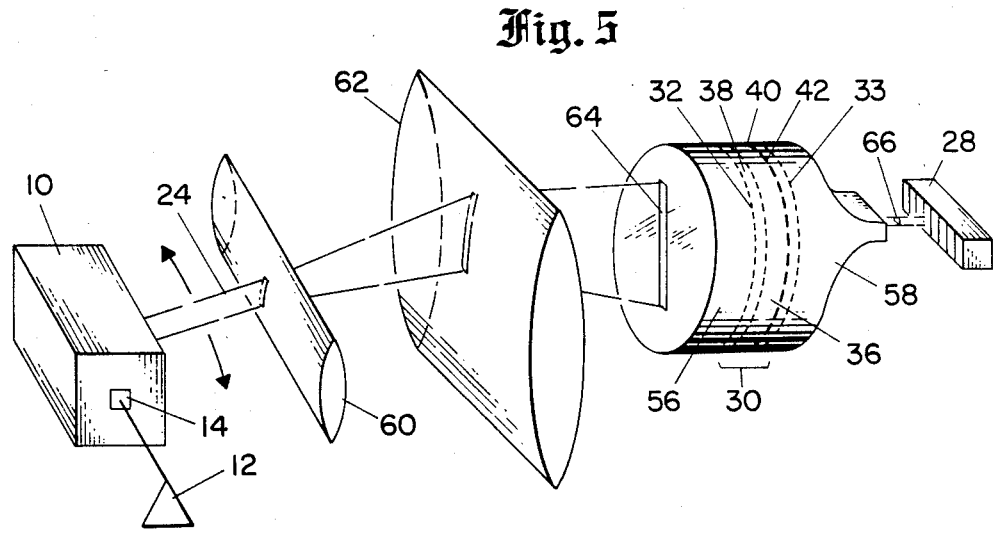

U.S. Patent  Mar. 5, 1985  Sheet 3 of 3  4,503,388

ACOUSTO-OPTIC SIGNAL DETECTION SYSTEM

The present invention relates to a radio frequency (RF) signal detector and, more particularly, to an acousto-optic signal detector of the Bragg cell variety.

BACKGROUND OF THE INVENTION

In RF signal monitoring systems, it is desirable to have some means for detecting and indicating when a signal being monitored contains transmissions at a particular frequency or frequencies. A Bragg cell is utilized with success for this purpose. Such monitoring is based on the characteristic of a Bragg cell to deflect a light beam passing therethrough as a function of an acoustical signal also passed through the cell. A narrow coherent light beam provided by a laser is directed toward and through the Bragg cell. The RF signal being monitored is connected to a transducer incorporated in the cell which causes an acoustical wave to be passed through the cell as a function of the RF signal input thereto.

The RF signal will cause an acoustical wave which will deflect the coherent light into a first order beam. If the RF signal contains more than one frequency component, the first order beam is deflected into more than one beam of coherent light. The majority of the beam emerges as an undeflected beam which is absorbed by a stop. Only about 1% of the beam is diffracted as the first order beam. In typical prior art systems, the first order beam is focused by a lens onto a sensing device which may comprise a plurality of photodetectors, especially if more than one frequency constitutes the RF signal. The exact position of the focused, first order beam upon the photodetector is a function of the RF signal frequency. The higher the frequency, the greater the angle of diffraction. The intensity of this first order beam is related to the intensity of the input signal. By identifying the various beam locations on the surface of the photodetectors, it is possible to detect the presence of a particular frequency transmission entering the Bragg cell.

As mentioned, the first order beam is only a small fraction of the original beam of coherent light from the laser. Consequently, only a weak or erratic signal may be generated in the photodetector device. Therefore, regardless of the electrical amplification which might be applied to an output circuit receiving the signal from a photodetector, the resultant signal and data processed therefrom will be no better than the original signal developed at the photodetector.

SUMMARY OF THE INVENTION

Accordingly, it is an object of the present invention to provide a signal detection system of the Bragg cell variety which will develop a stronger first order beam that may be utilized within a detection system to determine the frequency and amplitude of the RF signal received thereby.

The foregoing objective has been met by an acousto-optical signal detection system of the present invention which comprises a Bragg cell adapted to be connected to a signal source from which information relating to the signal is desired. Means are provided for passing a laser beam through the Bragg cell to form an undeflected beam portion and a first order beam portion. Fast acting light amplification means are operably disposed for receiving the first order beam at an input thereof and for outputting a secondary amplified first order beam at an output thereof. Finally, photodetector means are placed to receive the amplified first order beam at an input thereof and for generating an output signal at an output which is a function of the frequency of the signal entering the Bragg cell.

The realization that a weak first order beam could be amplified by light amplification means appeared at first to the inventors of the present invention to be a simple solution to the problem. However, when a light amplifier, such as that presently used within a night vision image intensifier device, was placed between the Bragg cell and the photodetector means, the amplifier device failed to improve the dynamic range of the system and, in fact, caused degradation of the system.

After much experimentation, it was found that the night vision image intensifiers presently on the market are designed for the relatively slow response of the human eye. Further, since these devices must be protected against a sudden increase in light intensity, such as that caused by the flash of a sudden explosion, the night vision image intensifiers are designed to include automatic gain control circuits which reduce their dynamic range of a signal detection system.

The unexpected failure of available light amplifiers lead to the discovery that a uniquely designed light amplification system will improve the dynamic range of the signal detection system. First, certain phosphors have a relative fast rise time and may be utilized to improve the dynamic range. Second, the automatic gain control circuit generally used in light amplifiers can be replaced with a novel arrangement which dissipates thermal energy and prevents the fly back of positive ions formed as photoelectrons strike the inner working surfaces of the light amplifier.

Third, the spectral matching of various components within the signal detection system and the light amplifier is successful in increasing the dynamic range. Further, the utilization of fiber optics for directing the coherent light from one configuration to another more satisfactory configuration, such as from a linear array to an areal array, brings about improvements in the dynamic range. Finally, the fiber optic may be utilized to spread the light as it is introduced to the light amplifier for more efficiently utilizing the amplifier and further increasing the dynamic range of the signal detection system.

DESCRIPTION OF THE DRAWINGS

The foregoing objects and advantages will be better understood after careful consideration of the following specification and drawings, wherein:

FIG. 3 is a cross-sectional view of a light amplifier incorporating features of the present invention;

FIG. 4 is a cutaway, perspective drawing of the amplifier shown in FIG. 3;

FIG. 5 is a perspective drawing of one embodiment of the present invention using lenses to spread the first order beam prior to applying the spread beam to the light amplifier;

DESCRIPTION OF THE PREFERRED EMBODIMENTS

Figure 1:
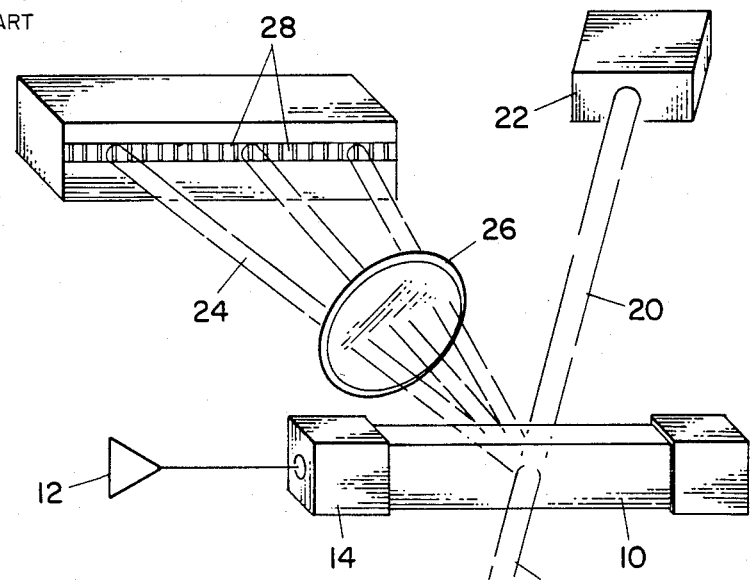
FIG. 1 is a schematic block diagram, shown in perspective, illustrating a prior art acousto-optic signal detection system in which the present invention has been incorporated.

An acousto-optic signal detection system is shown in simplified form in FIG. 1. This system is built around an acousto-optic deflector or modulator of the Bragg cell variety shown at 10 which may be formed from a crystal of lithium niobate. RF signals from various sources are applied to the Bragg cell 10 via an antenna 12 which applies the RF signals to a transducer 14 and, in turn, converts the RF signals to sound waves which are propagated through the lithium niobate crystal of cell 10. A laser 16 generates a beam of coherent light 18 which is directed through the Bragg cell 10 and emerges as an undeflected beam or zero order beam 20 to be absorbed by a stop 22. Approximately 1% of the beam entering the Bragg cell 10 is deflected by diffraction as a first order beam 24. In a typical acousto-optic system, the first order beam is focused by a transform lens 26 onto a light sensitive photosensor 28. In the system shown, a plurality of RF signals are intended to be received at the antenna 12. These signals propagate at different frequencies through the Bragg cell 24 to diffract beam 18 into a plurality of first order beamlets 24. The higher the frequency of the incoming RF signal received at antenna 12, the greater will be the angle of diffraction. Thus, the photosensor 28 includes an array of individual photodetectors aligned in a lineal pattern to intercept the first order beamlets 24 focused upon the input surfaces of the photodetectors by the transform lens 26.

It will be understood that the light striking the photodetectors 28 will generate an electrical signal in each detector whose position coincides with a particular frequency. If the light beam 24 is focused on a point between two fixed photodetectors 20, the centroid of the beam may be determined by the two photodetectors as described in a copending patent appliation, Ser. No. 435,108, filed Oct. 18, 1982 by Otis G. Zehl, Michael G. Price and Edward H. David, Jr., entitled Method And Device For Centroid Detection of a Beam of Electromagnetic Energy and assigned to the same assignee as the present case.

The intensity of the light falling upon the photodetectors 28 is proportional to the intensity of the incoming RF signals. By monitoring the incoming signals, it is possible to identify the frequency and amplitude with certainty and in real time, allowing hostile signals to be sorted from a myriad of harmless signals in the event the acousto-optic signal detection system is being utilized within an electronics warfare protection device, for example.

As mentioned above, the first order beam 24 represents only 1% of the original beam 18 from laser 16. Consequently, a weak or erratic input signal received at antenna 12 will result in an extremely weak and erratic signal at the photodetectors 28. Amplification of the signal emanated from the photodetector will not solve this problem. It was thus concluded that amplification of the first order beam or beamlets 24 was necessary. This may be accomplished by inserting a light amplification device 30 between Bragg cell 10 and the photodetector array 28 as shown in FIG. 2.

The light amplifier first tried by the inventors of the present invention was a night vision image intensifier, such as that manufactured by the Electron Tube Division of Litton Systems, Inc. of San Carlos, Calif., a sister division of the assignee of the present invention herein. The light amplifier supplied by Electron Tube Division did not function as initially expected. After some experimentation it was discovered that the response time of the night vision image intensifier was much too slow for use within a signal detection system. Accordingly, a new amplifier had to be developed through inventive techniques in order to accomplish the objects of the present invention.

Figure 2:
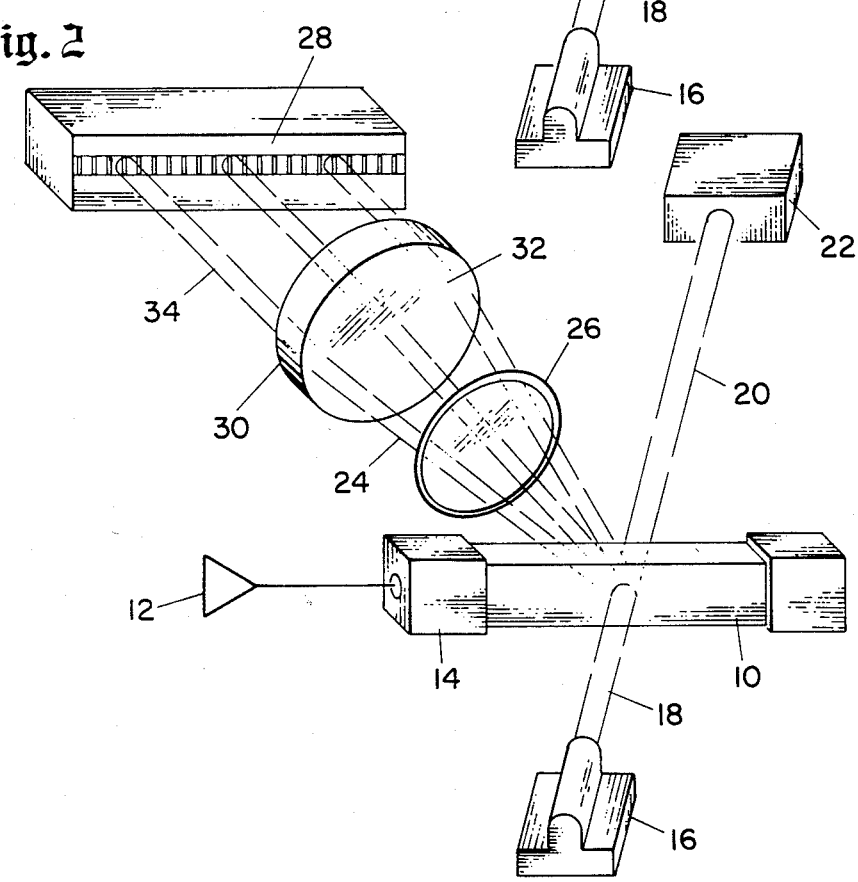
FIG. 2 is a simplified perspective view similar to FIG. 1 showing a light amplifier incorporated into a signal detection system.

Referring now to FIGS. 2, 3 and 4, the light amplification device utilized within the signal detection system of the present invention will be described. The light amplifier 30 includes input and output surfaces 32 and 33, respectively, upon which is focused the first order beam 24. Secondary first order beams 34 are emitted from the output surface 33 and directed toward the photodetector 28.

As seen in FIG. 3, the light amplifier 30 includes an evacuated shell 36 which mounts a photocathode device 38, the outer surface of which establishes the input surface of the light amplifier 32. Adjacent the photocathode 38 is a microchannel plate 40 which is placed adjacent a phosphor screen 42.

The microchannel plate is manufactured by placing a soluable glass rod for support into a glass tube which is then drawn slowly through an oven. By choosing the drawing speed and temperature properly, spaghetti-like fibers of approximately one-half millimeter in diameter are formed. These fibers are bundled and fused with enamel to form a square or hexagonal bundle. The bundle is next drawn through a second oven reducing the geometry again. The resulting smaller bundles are fused together to form a final bundle with single fiber diameters less than 10 microns. The final bundle is cut and sliced to produce a rough plate about 18 millimeters in diameter which is then ground and polished to produce optical surfaces. An etchant is then used to dissolve the cores, whose structural support is no longer required. The polished plate is then placed in an hydrogen atmosphere which causes the reduction of the inner surfaces of the channels formed within the drawn glass by the core removal. The silicon remaining provides a multiplication medium for high energy electrons entering each channel. Finally, electrodes 44 are deposited on the opposite polished surfaces and the plate is installed into the evacuated shell 36 prior to the insertion of the phosphor screen 42.

After searching for a suitable phosphor, it was found a phosphor designated as P-47 by the Joint Electron Device Engineering Council (JEDEC) having a rise time of 80 nanoseconds was most suitable for use upon the phosphor screen 42. This rise time was sufficiently fast enough to capture the high frequency RF signals as represented by beamlets 24 and worked nicely within the acousto-optic signal detection system. Further, the output of the phosphor P-47 peaks at about 4500 Angstroms whose wavelength is spectrally matched with the response of a blue-enhanced PIN photodiode which was used within the photodector array 28 having an extended response out to 4500 Angstroms. Other suitable fast phosphors include P-46 phosphor which has a response time of 120 nanoseconds at a peak output at approximately 5300 Angstroms. A last phosphor which works well in the present invention is P-48 phosphor which is a combination of the P-46 and P-47 phosphors mentioned above. Each of these phosphors has a response time of less than a microsecond and a persistence time small enough so that short pulses of interest are not attenuated. The P-47 phosphor may be purchased from the ITT Corporation.

The phosphor selected is deposited upon a suitable glass substance. Next, deposited upon the inner surface of the phosphor is a thin layer of aluminum 46 to improve the brilliance of the image and also prevent ion-spot formation. The thin layer of aluminum may also act as an electrode 48.

In the present invention it has been found that positive ions can be created at the inner surface of the phosphor screen 42 and within the microchannel plate 40. These positive ions are naturally attracted toward the negative photocathode 38 and interfere with its efficiency. In order to prevent this, a thin film of ceramic 50, such as alumina, is placed against the surface of the microchannel plate 40 between it and the photocathode 38. This thin film of ceramic is retained by a power supply 52, shown schematically in FIG. 3, at a potential difference between the photocathode 38 and the microchannel plate 40 of one kilovolt. The potential across the microchannel plate 40 is one kilovolt, while the potential between the surface of the microchannel plate 40 and the phosphor screen 42 is six kilovolts. The potential on the alumina ceramic 50 is sufficiently low to permit the passage of high speed and high energy electrons, while it is high enough to block the passage of the slower, lower energy positive ions which are burnt off of the microchannel plate 40 and phosphor screen 42.

A transparent film of chrome 54 is also placed on the inner surface of the photocathode 38. This film is thin enough to permit a high light level of operation but serves to prevent thermal damage through heating of the photocathode 38. The utilization of the chrome film 54 and ceramic film 50 sufficiently protects the photocathode so that an automatic gain control may be eliminated. The eliminated gain control, found in prior art night vision image intensifiers, serves to improve the dynamic range of the light amplifier of the present invention.

The photocathode of 38 may be one of several devices currently available. It has been found that the preferred photocathode should be selected to match the frequency of the laser beam utilized. For example, if a gallium arsenide or gallium aluminum arsenide laser were used having an output in the range of 7000 to 9000 Angstroms or a helium neon light laser having an output of 6328 Angstroms were used, the photocathode selected should be one designated as an S-20 by JEDEC with an extended red response. An S-25 photocathode may also be used with an aluminum arsenide or gallium aluminum arsenide lasers. The preferred embodiment utilizes a gallium arsenide photocathode which has a strong response between 7000 to 9000 Angstroms and provides optimal spectral matching with the gallium arsenide or gallium aluminum arsenide lasers mentioned above. The gallium arsenide photocathode is presently being developed by the Electron Tube Division and others. It has been found to be on the order of 40% efficient compared to a 10% efficiency for the S-20 and S-25 photocathodes mentioned above. This higher efficiency aids in improving the dynamic range of the acousto-optic signal detection system of the present invention.

Another feature which improves the dynamic range of the light amplifier 30 is the use of smaller microchannels than those standardly used within the night vision image intensifiers of the prior art. Previous intensifiers have used a channel diameter of 12.5 microns. It has been found that a 10 micron channel will provide as much as a 50% increase in the dynamic range of the signal detection system since the dynamic range deteriorate as a square of the diameter of the microchannels.

Another step which has been taken to improve the dynamic range is improved cleaning techniques wherein the microchannel plate 40 and phosphor screen 42 are subjected to a vacuum bakeout and electron scrubbing to clean out those impurities that could outgas during operation to create positive ions.

The opertion of the light amplifier thus described is as follows. When a photon from the first order beam 24 strikes the input surface 32, a photoelectron is emitted and accelerated from the inner surface of photocathode 38 toward the adjacent surface of the microchannel plate 40. As the photoelectron enters a 10 micron channel within the plate, it knocks additional electrons from the walls of the plate which are, in turn, accelerated as secondary bunches of photoelectrons toward the phosphor screen. The photoelectrons strike the phosphor screen 42 to provide light through cathodoluminescence which is sensed by the photodetector 28. In some embodiments, it may be desirable to sense the secondary photoelectrons directly rather than converting them back to light energy to be sensed by the photodetector. In this arrangement the electrons may be applied directly to multianode devices or electron bombardment mode semiconductor devices each mounted directly within the vacuum envelope 36. A microchannel plate multiple phototube utilizing an anode array is currently on the market. Such a device may be purchased from the Electro-Optical Products Division of ITT, located in Fort Wayne, Ind.

It has been found that the light amplifier 30 may be more efficiently utilized by placing fiber optics at the input and output surfaces 32 and 33, respectively. As seen in FIG. 5, these bundles may be provided with polished ends which are abutted directly against the input and output surfaces 32 and 33 of amplifier 30 and retained there by a suitable mechanical mounting with the evacuated shell 36. In FIG. 5, the light amplifier 30 is provided with a bundle of first input fiber optics 56 and a bundle of second output fiber optics 58. A laser beam, not shown, is passed through the Bragg cell 10 where the first order beam 24 is focused by a lens 60 into an elongated beam which is then expanded further by a second lens 62. The resultant elongated image 64 on the input surface of the fiber optic bundle 56 is then transmitted directly to the input surface 32 of the photocathode 38. In this manner, the amount of light is spread over a wider area giving the light amplifier 30 a smaller but larger input signal to work with. The light amplifier 30 functions more efficiently in this arrangement than when the light is concentrated in a tiny focused image upon surface 32. It will be seen that the output bundle of fiber optics 58 may be arranged with a large input surface and a constricted output surface for concentrating the amplified light from enlarged image 64 into a small concentrated image 66 which is then applied to the input surface of photodetector 28. In the embodiment discussed below, note that the output fiber optics 58 work best when flush against the surface of the photodetector 28.

Figure 6:
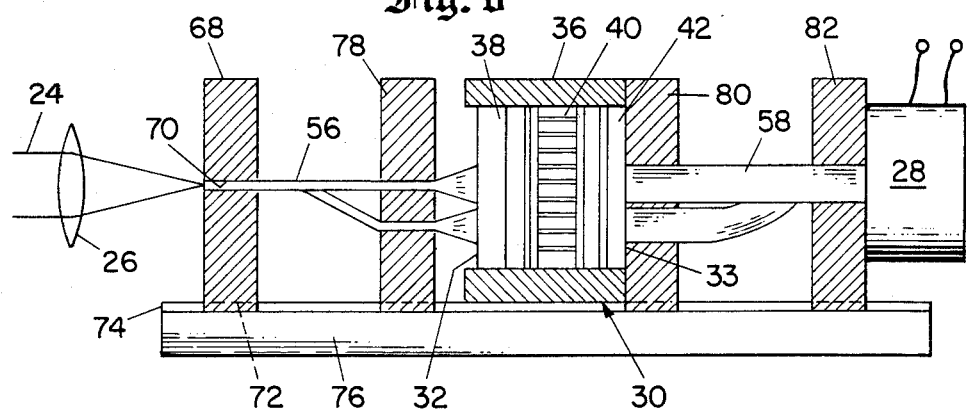
FIG. 6 is a side elevation showing another embodiment of the present invention utilizing fiber optics to spread the first order beam prior to its application to the light amplifier.
Figure 7:
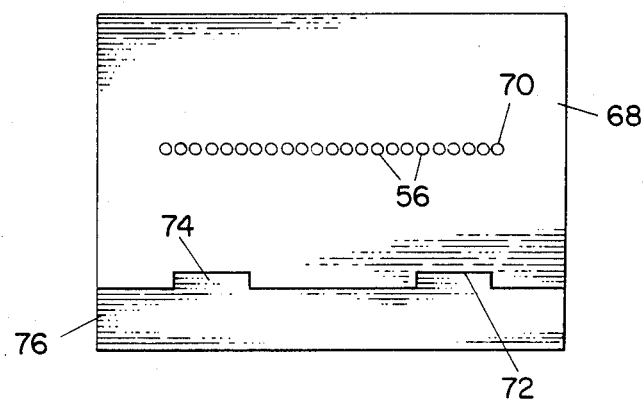
FIG. 7 is an end elevational view showing a plate into which fiber optics are mounted representing the input surface of a fiber optic bundle upon which the first order beam may be focused.
Figure 8:
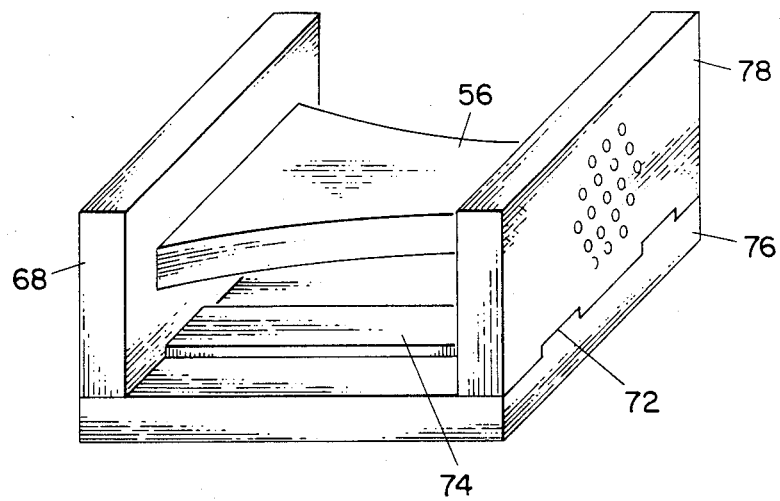
FIG. 8 is a perspective view showing the fiber optic bundle which receives the first order beam and applies that beam to the light amplifier.

Referring now to FIG. 6, the preferred embodiment of a light amplifier 30 which incorporates many of the features discussed above is shown. Here, the first order beam 24 is focused by the transformed lens 26 into a sharp image upon the input surface of a first fiber optic bundle 56 mounted within a mounting plate 68. As seen in FIG. 7, the mounting plate 68 includes a plurality of apertures 70 slightly larger than the diameter of the first fiber optics 56. As seen in FIGS. 6 and 8, the plate 68 is provided with grooves 72 which align with suitable tongues 74 on the upper surface of a base plate 76. The pattern of the apertures 70 and fiber optics 56 mounted therein is arranged to coincide with the pattern of the diffracted first order beam 24 whose deflection angle is dependent on the frequency of the input RF signal. One advantage of the fiber optic arrangement is that the pattern can be adjusted to fit the pattern required by the signal detection device. The output ends of the first fiber optics 56 mounts in a hexagonal pattern within a second base plate 78, FIG. 8. The close package of hexagonally arranged fiber optics provides a pattern of individual light spots which may be efficiently utilized upon the input surface 32 of the photocathode 38.

In the preferred embodiment, the output ends of fiber optic bundle 56 are spaced away from the input surface 32 a sufficient distance to permit the light beams to spread. In the present working model, the diameter of the fiber optics 56 is approximately one hundredth of an inch while the light beam is permitted to spread to between 1 to 2 millimeters. Thus, it will be seen that the light beam is enlarged by a factor of 4 to 8 over its original size. In this manner, the input surface 32 of photocathode 38 may be nearly fully illuminated for more efficient use.

The evacuated shell 36 is mounted upon a third mounting plate 80 which also mounts the input ends of the second fiber optic bundle 58 arranged to transform the light pattern from a hexagonal shape back to a linear shape. The diameters of the fibers in second fiber optic bundle are equal to or slightly larger than the 1 to 2 millimeter size of the light beam which is spread upon the input surface 32 of the light amplifier 30. A final plate 82 mounts the output end of the second fiber optic bundle 58 and the photodetector 28. In the embodiment shown, the fiber optic bundle 58 is flush with the output surface 33 of the phosphor screen 42 and the input surface of the photodetector 28.

While the pattern of the input and output fiber optic bundles has been described as a linear array merging to a hexagonal array and then a hexagonal merging to a linear array, it will be understood that the advantage of the fiber optic input and output bundles is that they may be arranged to match any desired shape to match the configuration of the amplifier 30 and photodector 28. The relative size of the fiber optic bundles 56 and 58 is also a matter of design choice. However, it is generally desired to make the input bundle smaller than the output bundle in order to efficiently utilize the light amplifier 30. There are several ways available to spread the light beam 24 as it emerges from the output end of the first fiber optic bundle 56. By spacing the output end from the surface 32 of the photocathode, the most convenient method has been utilized. However, the fiber optic bundles themselves could be spread or other optical devices could be used. At the output side of the light amplifier 30, the phosphor causes light to emanate in all directions of a 180° fan. Thus, it is most desirable to place the input end of the second fiber optic bundle 58 flush against the output surface 33. While other variations are possible, it will be understood that the present invention should be limited only by the appended claims.

We claim:

1. An acousto-optic signal detection system of the Bragg cell variety having improved dynamic range comprising:
   a Bragg cell adapted to be connected to a signal source;
   means for passing a beam of electromagnetic energy through said Bragg cell to form an undeflected beam portion and a first order beam portion;
   light amplification means responsive to said first order beam in less than one microsecond, operably disposed for receiving said first order beam at an input thereof and for outputting a secondary amplified first order beam at an output thereof;
   photodetector means operably disposed to receive said amplified first order beam at an input thereof and for generating an output signal at an output thereof which is a function of the frequency of the signal entering said Bragg cell;
   fiber optic means operably disposed for receiving said first order beam at an input thereof and for spreading said first order beam at an output thereof before said beam is received by said light amplification means.

2. An acousto-optic signal detection system, as claimed in claim 1, wherein said fiber optic means is spaced away from said input of said light amplification means to spread said beam upon the input surface thereof.

3. An acousto-optic signal detection system, as claimed in claim 1, additionally comprising:
   fiber optic means operably disposed for receiving said secondary amplified first order beam at an input thereof and for outputting said beam to said photodector means.

4. An acousto-optic signal detection system, as claimed in claim 3, wherein said fiber optic means is operably disposed flush against said output of said light amplification means and flush against said input of said photodector means to prevent the spread of said beam therebetween.

5. An acousto-optic signal detection system, as claimed in claim 1, additionally comprising:
   said Bragg cell connected to receive a plurality of signals from said signal source, and to deflect said beam of electromagnetic energy into a first order beam having a plurality of beamlets offset at a plurality of lineal points within said first order beam as a function of the frequencies of said signals entering said Bragg cell;
   first fiber optic means for receiving said first order beam at an input thereof, arranged in a lineal array to receive said beamlets and for outputting said beam to said light amplification means in an areal array arranged to match the input surface area of said light amplification means;
   said first fiber optic means having a width substantially equal to the width of said beamlets;

means for spreading the electromagnetic energy of each of said beamlets upon said input surface of said light amplification means;

second fiber optic means for receiving said plurality of spread beamlets in said secondary amplified first order beam at an input thereof arranged in an areal array to match the output surface area of said light amplification means and for outputting said beam to said photodector means in an areal array arrange to match the input surface area of said photodector means;

said second fiber optic means having a width substantially equal to the width of said spread beamlets.

6. An acousto-optic signal detection system, as claimed in claim 5, additionally comprising:

said means for spreading said beamlets is a spaced relation between the ends of said first fiber optic means and the input surface of said light amplification means; and said input of said second fiber optic means is operably disposed flush against said output surface of said light amplification means to prevent the spread of said beamlets.

7. An acousto-optic signal detection system, comprising:

an acousto-optic cell having a transducer connected to receive a signal to be detected;

a source of coherent light;

means for passing said coherent light through said acousto-optic cell to form an undeflected beam and a deflected first order beam;

first fiber optic means for receiving said first order beam at an input thereof and for outputting at an output thereof a spread first order beam;

light amplification means for receiving said spread first order beam at an input thereof and for outputting a spread and amplified first order beam;

second fiber optic means for receiving said spread and amplified first order beam at an input thereof and for outputting said beam; and photodector means for receiving said spread and amplified first order beam at an input thereof and for generating an output signal which is a function of the frequency of the signal received by said acousto-optic cell.

8. An acousto-optic signal detection system, as claimed in claim 7, additionally comprising:

said signal to be detected includes a plurality of signals having differing frequencies;

said acousto-optic cell deflects said coherent light into a first order beam having a plurality of beamlets at differring angles as a function of said differing frequency;

said first fiber optic means includes a plurality of fibers operably disposed to receive said beamlets of said first order beam and to output said beamlets in a spread pattern over the input surface of said light amplification means; and said second fiber optic means includes a plurality of fibers operably disposed to receive said spread and amplified beamlets.

9. An acousto-optic signal detector system, as claimed in claim 7 wherein said first fiber optic means spread said first order beam by an operably disposed spacing between said output of said fiber optic means and said input of said light amplification means.

10. An acousto-optic signal detector system, as claimed in claim 9, wherein acousto-optic cell deflects said beamlets into a linear pattern, and said first fiber optic means have said input formed in a linear pattern and said output formed in an areal pattern to match said input of said light amplification means.

* * * * *